United States Patent [19]

Skrzypczak

[11] Patent Number: 4,677,439

[45] Date of Patent: Jun. 30, 1987

[54] DELAY DEVICE AND THE USE THEREOF IN THE DECODING DEVICE OF DISTANCE MEASURING EQUIPMENT

[75] Inventor: Jean-Michel Skrzypczak, Paris, France

[73] Assignee: Thomson-CSF, Paris, France

[21] Appl. No.: 603,891

[22] Filed: Apr. 25, 1984

[30] Foreign Application Priority Data

Apr. 26, 1983 [FR] France ............................. 83 06828

[51] Int. Cl.$^4$ ............................................. G01S 7/30
[52] U.S. Cl. ..................................... 342/47; 307/595;
307/602; 328/55
[58] Field of Search ............ 343/6.8 LC, 7.3;
307/463, 590, 595, 597, 600, 602, 603; 328/55;
342/47

[56] References Cited

U.S. PATENT DOCUMENTS

| | | | |
|---|---|---|---|
| 3,913,021 | 10/1975 | McCarthy et al. | 307/602 X |
| 4,260,912 | 4/1981 | Bjorke | 307/597 |
| 4,455,556 | 6/1984 | Koshio | 343/7.3 |
| 4,530,107 | 7/1985 | Williams | 307/602 X |

OTHER PUBLICATIONS

Electronics, vol. 50, No. 2 (Jan. 20, 1977), "The 65-k RAM Looms Large, But CCDs and Bubbles are 'Iffy'," pp. 94–96.

IBM Technical Disclosure Bulletin, vol. 22, No. 1 (Jun. 1979), G. Goertzel et al, "Variable Delay Line," pp. 419–420.

Primary Examiner—T. H. Tubbesing
Attorney, Agent, or Firm—Oblon, Fisher, Spivak, McClelland & Maier

[57] ABSTRACT

A device for delaying an electric signal comprising means for acquiring the signal, sampling it at a frequency $f_e$ and delivering it in parallel in the form of binary words of M bits, at a frequency $f_m$ such that $f_m = (f_e/M)$; means for storing said binary words for a given period of time and operating at the frequency $f_m$ and means for restoring at frequency $f_e$ the signal from the binary words.

7 Claims, 10 Drawing Figures

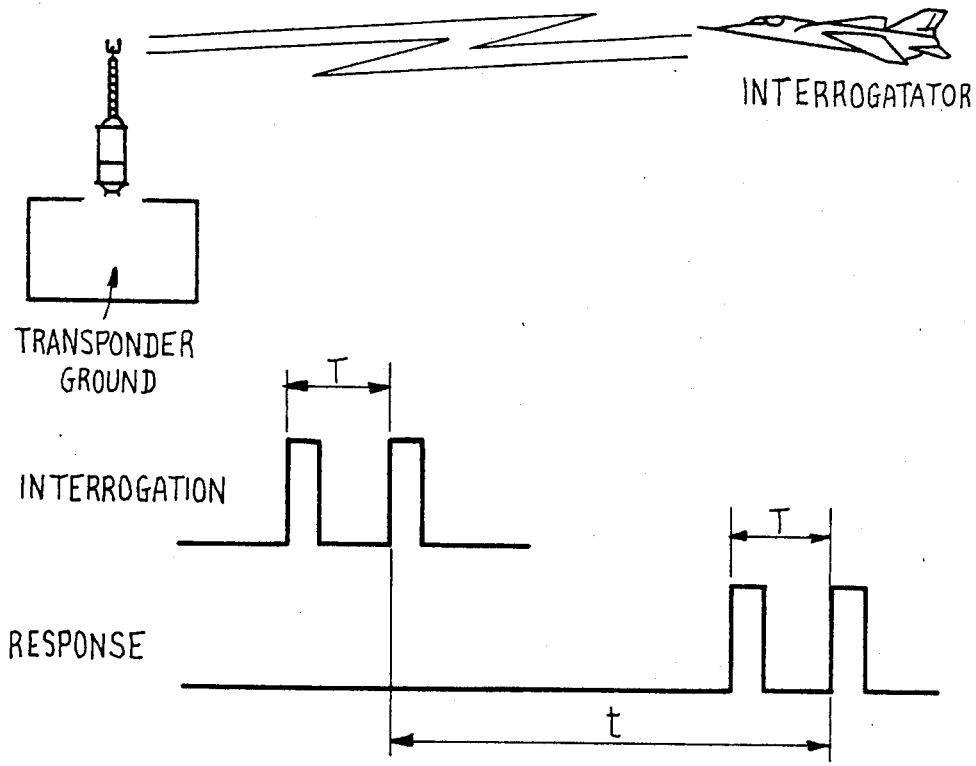

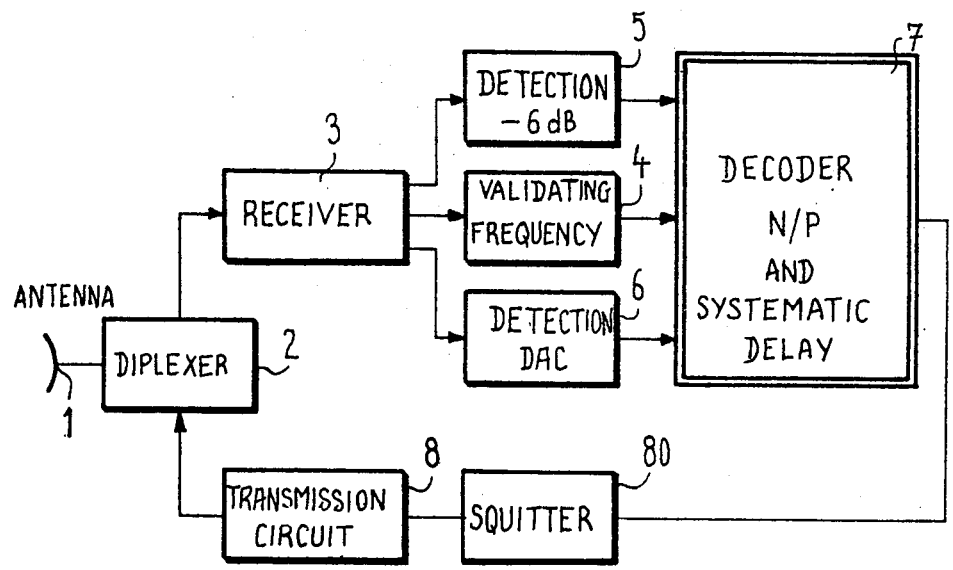
FIG_3 PRIOR ART
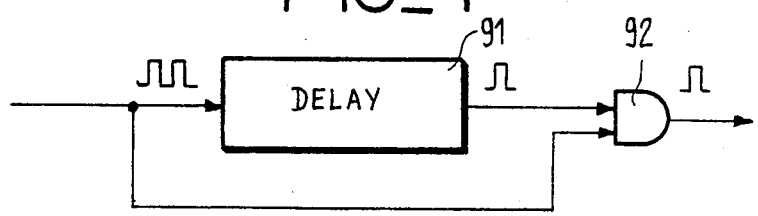
FIG_4 PRIOR ART
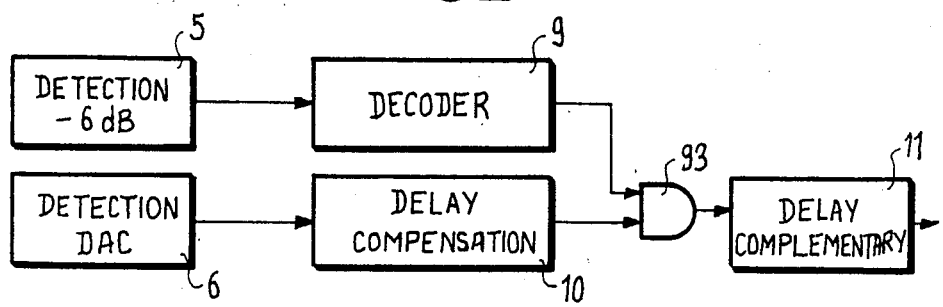
FIG_5 PRIOR ART

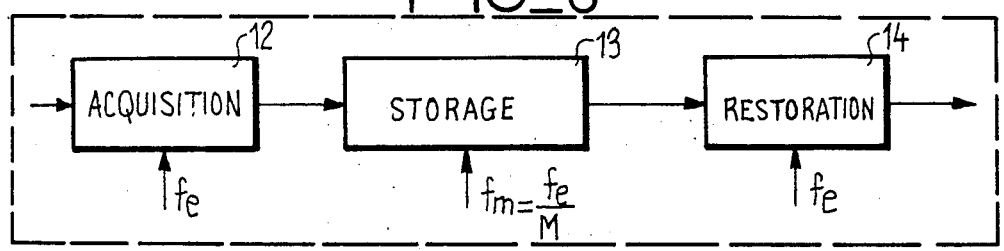
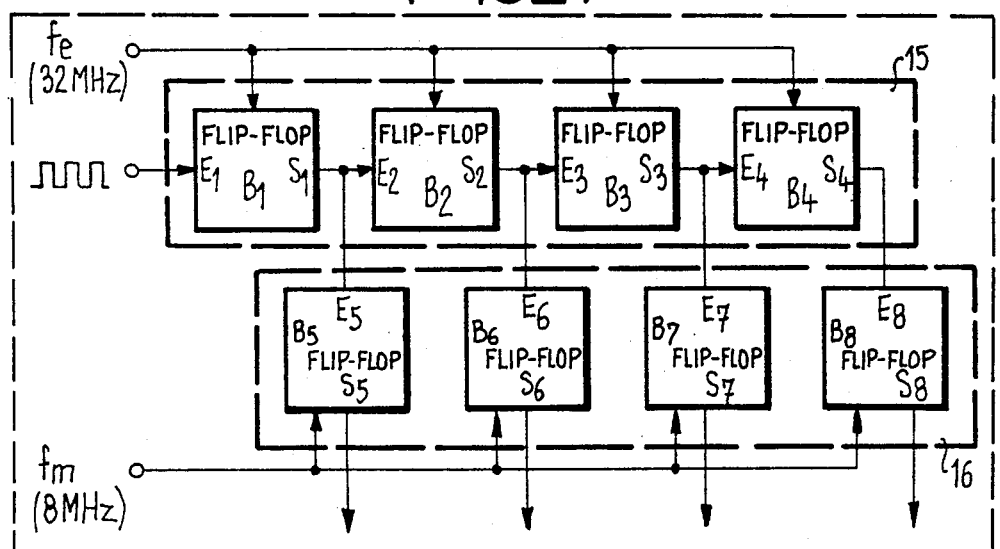
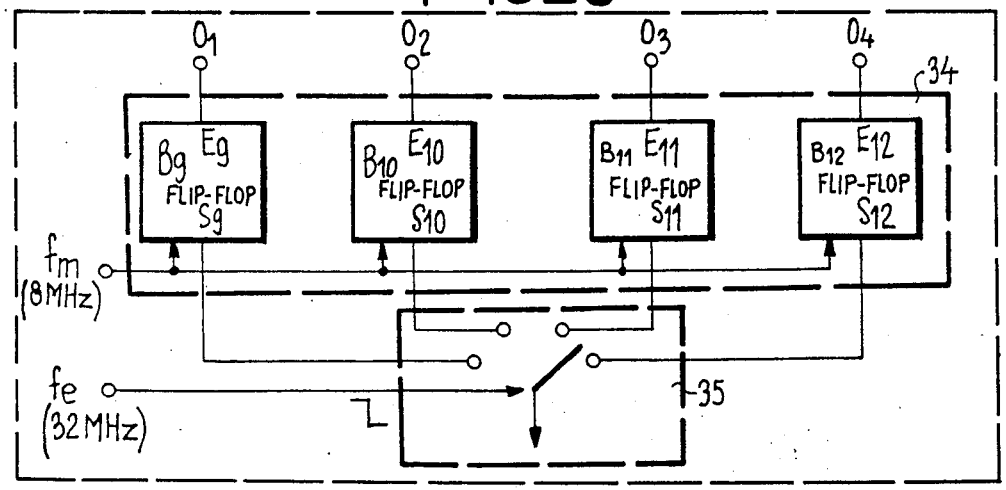

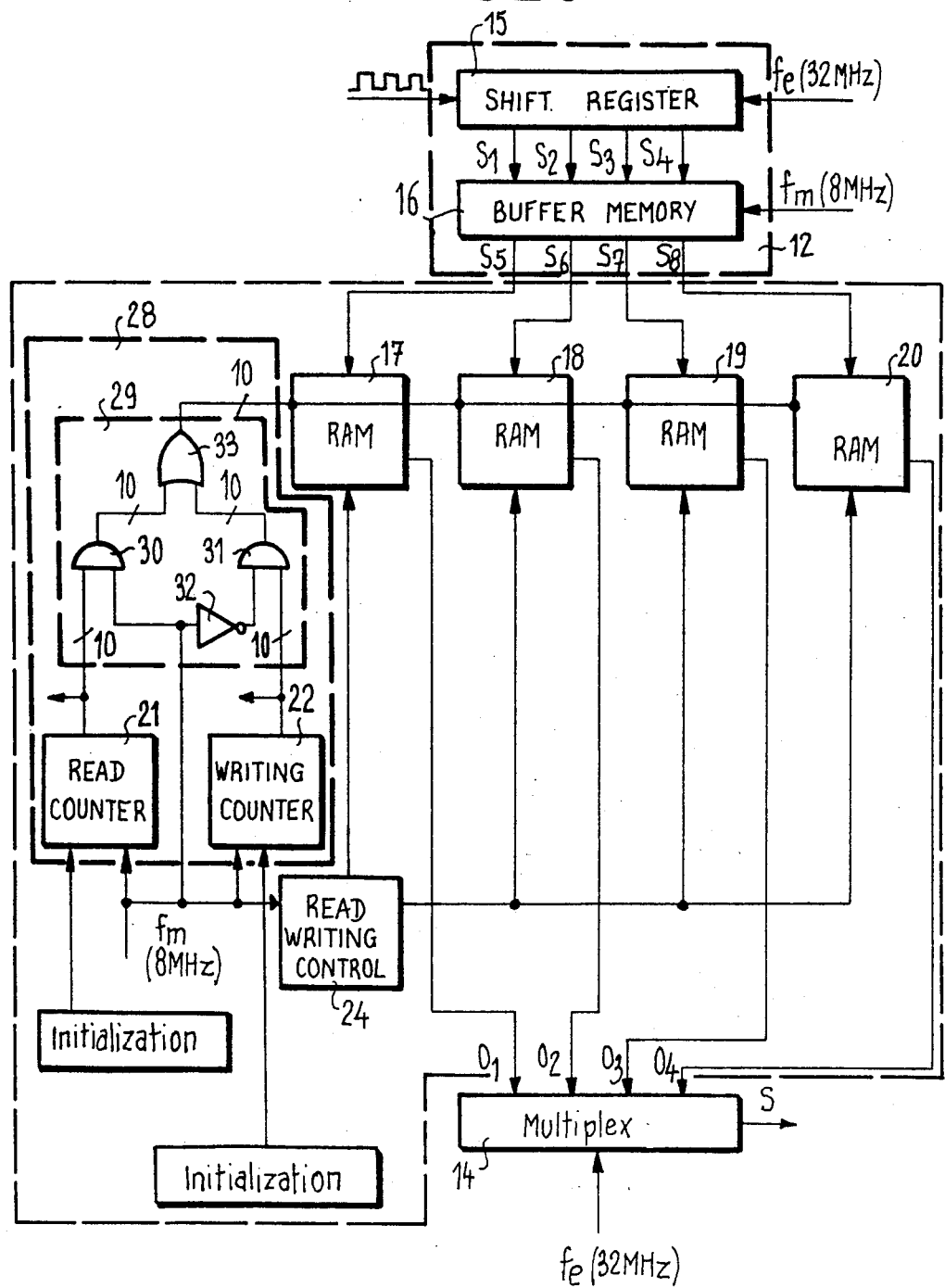

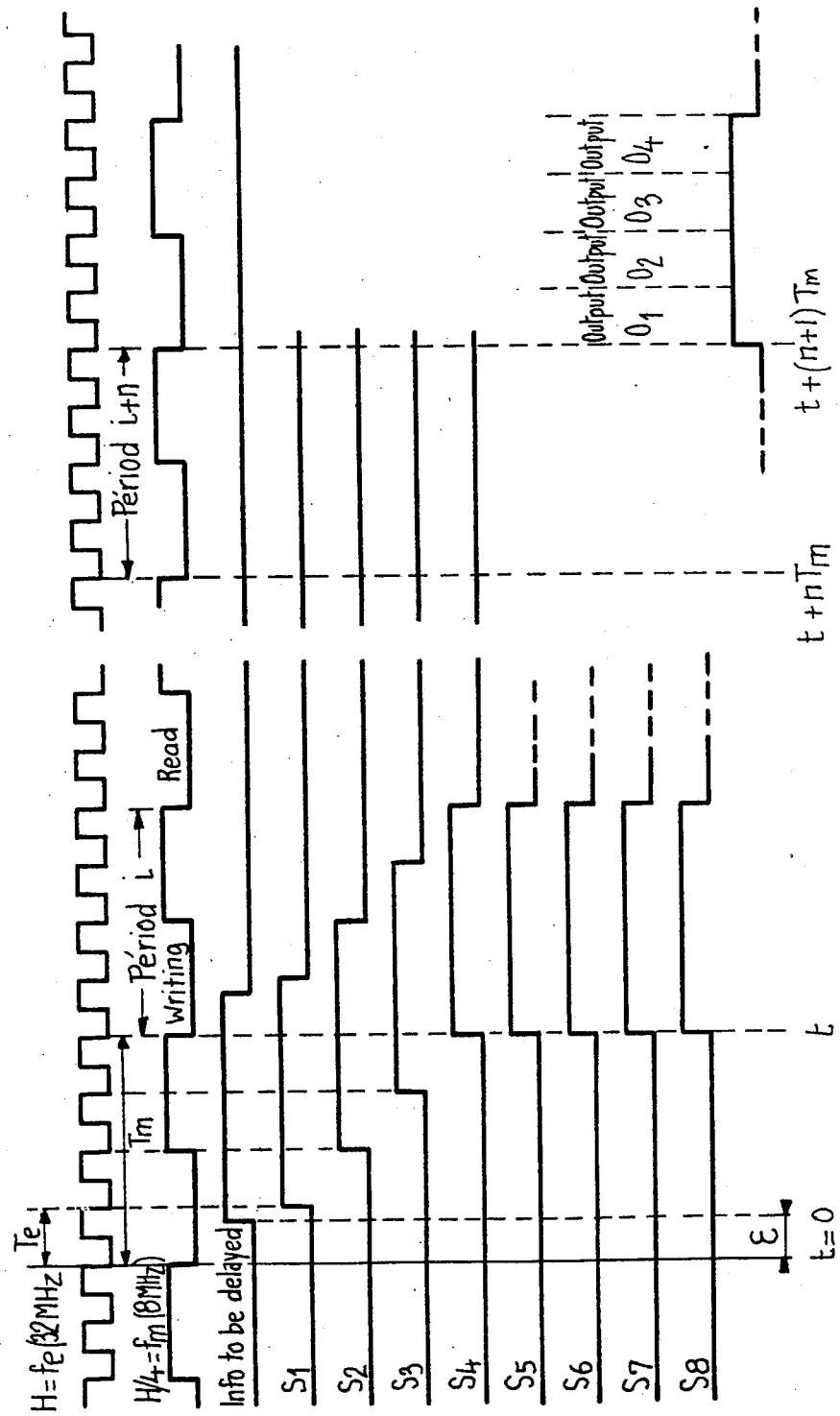

DELAY DEVICE AND THE USE THEREOF IN THE DECODING DEVICE OF DISTANCE MEASURING EQUIPMENT

BACKGROUND OF THE INVENTION

1. Field of the Invention

The invention relates to a delay device and the use thereof in the decoding device of distances measuring equipment.

2. Description of the Prior Art

A distance measuring system, forming the subject of the present invention, or D.M.E. for Distance Measuring Equipment—is equipment for aiding air navigation, comprising interrogator equipment placed on board an aircraft (airplane, balloon or helicopter, for example) and transponders placed on the ground and whose role is to measure the oblique distance between the aircraft in flight and the DME stations on the ground. This DME system belongs to the polar coordinate navigational system, whose standards have been standardized by the International Civil Aviation Organization (I.C.A.O).

The operating principle of a DME system is the following. The interrogator equipment placed on board the aircraft sends interrogations signals to the ground stations, in the form of pulse pairs spaced apart by a time T, thus defining the interrogation code. The ground stations receive the interrogations which are intended for them without having to know their geographical origin and send back synchronous responses to the interrogation, also in the form of pulse pairs characterized by a response code T'. By measuring the delay t between the transmission of the interrogation by the equipment, on board the aircraft, and the reception of the response, transmitted by the ground station, the equipment on board the aircraft calculates the oblique distance between the aircraft and the ground station (FIG. 1).

The delay has two components:
- the propagation time of the pulse pairs between the aircraft and the ground and vice versa;
- a systematic delay $\tau$ due to the ground transponder and fixed at a constant value for a given station, so that the information received by the aircraft has time to be processed. Thus, the oblique distance D between the aircraft and the ground station is given by the formula:

$$D = \frac{(t - \tau)}{2} \cdot c$$

with t=the time elapsing between the interrogation transmitter by the aircraft and the response received by the ground station, and c=the speed of propagation of the information.

The subject matter of the application relates to the transponder situated in the ground DME station. According to the I.C.A.O. standards, the frequency bands used for transmissions in a DME system is between 962 MHz and 1213 MHz, subdivided into 1 MHz channels, allocated to the different ground DME stations. In addition to this transmission over a particular channel, each transponder may operate in four different modes, called modes X, Y, W or Z and themselves each characterized both by a given code for the interrogations and the corresponding code for the responses and by a given systematic delay $\tau$. FIG. 2 shows the specification table for the different operating modes of a DME transponder according to the ICAO standards.

Channels X and Y are used by the DME-N system, also called "en route" system. Channels X, Y, Z, W are used by the DME-P precision system which are essentially associated with the ILS landing system. The DME-P interrogation device in the approach mode uses, depending on the distance D measured on board, the N or P modes (distance D greater than 7 nautical miles for mode N and distance D less than 7 nautical miles for mode P) in accordance with FIG. 2 and changes the coding of the interrogation pulses as a function of the selected mode. This double interrogation mode system proposed by THOMSON-CSF has been adopted by the AVOP of ICAO as a general basis for operation of the DME-P system.

Thus, an aircraft desiring to known its oblique distance with respect to a given ground DME station, will transmit pulses pairs for interrogating this station. The ground DME station will only reply if it recognizes as valid the interrogation which it receives, in other words:

- if the interrogation is made over the channel which is allocated to it and
- if the code of the interrogation, that is to say the spacing between two pulses, corresponds to the operating mode programmed in this station.

The accuracy obtained by the DME system depends on the type of interrogation chosen by the aircraft. When the aircraft is in the interrogation mode up to 200 nautical miles or more around the ground beacon, it uses interrogations of the "normal" type —N— to which the ground station will reply with responses of the same type (i.e., N). The oblique distance information between the ground station and the aircraft will be given with a precision of 0.25 nautical miles. On the other hand, if the aircraft is in the landing mode in a zone less than 7 nautical miles about the ground station, the accuracy with which the oblique distance information will be given will be better, of the order of 30 meters, by using interrogations of the "precision" type-P.

FIG. 3 shows the block diagram of a DME transponder placed in a ground station and whose functional description follows. According to the foregoing the DME transponder receives the interrogation pulse pairs from aircraft, decodes the signals received so as to recognize those which it considers as valid i.e. that is to say those which are intended for it, initiates the responses to the interrogation while taking into account the systematic delay, and codes the responses before supplying the transmission signals so as to have the time to process the received interrogations.

For that, the transponder is formed by an antenna 1 which is omnidirectional for an "en route" DME station used for navigating and preferably directional for a "landing" DME station—called DME.P—during landing approach, picking up the interrogations coming from the aircraft; the low or high level signals received with random distribution, pass through a diplexer circuit 2 before passing into a receiver circuit 3 which, after amplification and detection, delivers the interrogation pulse pairs in video form. For proper use of this video information, the pulses pass through three processing circuits 4, 5 and 6 before being recognized valid and delayed by a circuit 7, forming the subject of our application. Finally, the DME transponder comprises a circuit 80 for coding the responses intended for the transmission circuit 8; these responses then pass through the diplexer 2 before being broadcast by the antenna 1.

The video information, at the output of the receiver circuit 3, is formed of a large number of pulses, some corresponding to the valid interrogations, i.e. having the correct spacing corresponding to the ground DME station considered, the others corresponding to the interrogations intended for neighboring ground DME stations not having the same mode and yet others corresponding to multipath echos which may themselves considerably disturb valid interrogations. Since this video information is used for determining the distance between an aircraft and a ground station, it is important to be free of the errors which might arise from any modification that might exist in the interrogation signal received, due to parasites. Therefore, to use this video information as reliably as possible, three circuits are used the purpose of one of which, circuit 4, is to validate the video pulses with respect to the reception frequency. Receiver 3 has an intermediate wide band frequency channel, of the order of 4 MHz, for letting through the pulses having a rapid rising front, which results in taking into consideration several adjacent channels and so mixing the valid interrogations with those of the neighboring channels. Circuit 4 only validates the interrogation received at the correct frequency of the channel corresponding to the ground DME station considered.

The second circuit 5 is a circuit for detecting the arrival time of the pulses, at −6 decibels (dB) below the peak value of the pulses received by the transponder. The output of this circuit is used for processing the N type interrogations and for verifying the coding of the interrogations pulses.

Finally, the third circuit 6 is a circuit for detecting the arrival time of the first pulse of an interrogation pair of the P type. The arrival time of such a pulse must be accurately known and must be free of errors due to the deformation of this pulse by its own echo for it is important for the pilot of the aircraft to know, with the highest possible accuracy, the distance of the aircraft with respect to the ground. So the detection of the arrival time of the first pulse must be made as rapidly as possible before its deformation. For that, a circuit is known used under the name D.A.C.—"Delay and Compare'-'—the operation of which based on a delay and a comparison is described in the French patent application published under No. 2 497 958 in the name of the applicant corresponding to U.S. Pat. No. 4,518,694.

When the pulses received by the DME transponder have been shaped by the three preceding circuits, the path leads to the dual function circuit 7 which decodes the pulse pairs for identifying the valid interrogations and introduces a delay τ, which is constant and fixed at a given value for the ground station for processing the information received.

Then, the transponder DME responds to the aircraft by emitting signals formed from pulse pairs, coded by a coder circuit 80 in accordance with the operating mode of the station, and by coded pulses coming from a so called "squitter" circuit whose purpose is to maintain a minimum rate of pseudo-random transmission at the transmitter. The purpose of the "squitter" is essentially to maintain a constant charge rate for the transmitter; for that, if the number of responses to real interrogations decreases the number of pulses pairs generated by the squitter increases and vice versa. Finally, the transmission circuit 8 insures generation of the signals which will be applied to antenna 1.

Since the invention relates to the decoder circuit 7, a general outline the principle for decoding the interrogation pulses received by the DME transponder on the ground and describe the different embodiments of decoders already existing will be provided below.

FIG. 4 shows the general diagram of a decoder 9. The principle of the decoding is as follows: in a circuit 91 the first pulse of the pair received by the transponder is delayed by a time equal to the code to be recognized—the code being represented by the spacing between the first and the second pulse—then the signal obtained at the output of the delay circuit is compared with the non delayed signal; the comparison may be made by means of an AND gate 92. If the pulse pair thus processed presents the correct code, there is coincidence between the second pulse and the first pulse at the output of the delay circuit. To complete the description of the transponder, the decoding principle will be briefly described associated with the systematic delay, the diagram of which is given in FIG. 5. It was mentioned above that the decoding took place from a signal detected at −6 dB below the peak value, this is why the decoder circuit 9 is connected to the output of the −6 dB detection circuit 5. When the decoder circuit 9 has identified the interrogation sent by the aircraft and has recognized it as conforming to the mode of the ground DME station, it validates the pulses at the output of a first compensation delay circuit 10 by means of an AND gate 93 for example. Circuit 10 is connected to the output of the DAC detection circuit 6 which accurately gives the arrival time of the first pulse of the pair serving for the DME-P interrogation. The compensation delay is equal to the time $R_c$ used for decoding the pulses and is therefore intended to compensate the time required for verifying the coding of the interrogation. The pulses thus validated then pass to a circuit 11 providing a complementary delay $R_{co}$, which added to the compensation delay, gives the systematic delay τ:

$$\tau = R_c + R_{co}$$

At the present time, different solutions exist to the problem arising from the high accuracy required for decoding the interrogations pulses and for the systematic delay τ. This accuracy must be greater in the "precision" P type interrogations but the solutions which will be described hereafter and which are suitable for type P should also be suitable for type N.

Considering the accuracy required for the systematic delay, on the one hand:
 ±200 ns for N type interrogations and
 ±30 ns for P type interrogations and the variations of the delay $R_c$ required for the decoding time and which must be programmable as a function of the mode of the station, on the other hand:
 12 μs for mode X, type N and
 42 μs for mode Y, type P the problem then consists in providing an accurate delay of
 ±30 ns which may reach 42 μs in mode Y, type P.

One of the solutions used at the present time consists in delaying the interrogation pulses by means of a multi-stage shift register, formed from a number N of series mounted storage circuits controlled by the same clock, i.e. a periodic signal of period $T_e$. The maximum delay obtained with N stages is equal to $N \cdot T_e$ with a resolution equal to $T_e$. Since the delay thus obtained is programmable, so formed from a variable number of stages, registers must be used constructed either in accordance with the so called T.T.L. (Transistor-Transistor-Logic) technology or in accordance with the so called M.O.S. (Metal Oxide Semiconductor) Technology.

The drawbacks of this solution come from the limitations proper to the two technologies. The accuracy required for interrogations of type P (+ or −30 ns) implies a high block frequency. Now, in MOS technology, the frequency does not exceed 20 MHz and so does not allow the required resolution to be obtained. In so far as the value of the delay $R_c$ to be provided is concerned, it entails a considerable number of interrogator cases each forming a register, particularly in TTL technology.

Another solution which is also known consists of using a delay circuit formed from chains of counters disposed in parallel. The efficiency of such a system, the number of pulses at the output with respect to the number of pulses at the input, depends on the number of counters connected in parallel. The limitation of the number of chains causes a tendency to saturate-P, the delay circuit which then quickly becomes unavailable, all the more so if the multipaths or other interrogations of different codes are numerous.

SUMMARY OF THE INVENTION

The aim of the present invention is to overcome these different drawbacks by providing a circuit for delaying an electric signal, comprising:

means for acquiring the electric signal, sampling it at a given frequency $f_e$ and delivering it in parallel in the form of M bit binary words, at a frequency $f_m$ such that:

$$f_m = f_e/M$$

means for storing the signal in the form of binary words, operating at the frequency $f_m$ and storing each binary word of M bits for a given period of time, means for restoring, at frequency $f_e$, the electric signal from M bit binary words read out in parallel from the storage means.

BRIEF DESCRIPTION OF THE DRAWINGS

Other features and advantages of the invention will appear from the following description, illustrated by the following Figures which, apart from FIGS. 1 to 5 which have already been described and which relate to the prior art, show:

FIG. 6: the block diagram of the delay circuit in accordance with the present invention;

FIG. 7: the acquisition means of the delay circuit of the invention;

FIG. 8: the storage means of the delay circuit of the invention;

FIG. 9: the restoration means of the delay circuit in accordance with the invention; and FIG. 10: the timing diagram for the delay of a pulse passing through the delay circuit in accordance with the invention.

DESCRIPTION OF THE PREFERRED EMBODIMENTS

The elements fulfilling the same functions with a view to obtaining the same results in the different Figures bear the same references.

The delay circuit of the invention will now be described in its application to a decoding device for a DME system.

As shown in FIG. 6, which represents the block diagram of the delay circuit 7 of the invention, this circuit may be broken down into three systems 12, 13 and 14 having as respective functions the acquisition of the information to be delayed, the storage thereof for a given period of time and finally restoration thereof, it being understood that the acquisition and restoration take place at a high frequency $f_e$ whereas the propagation of the stored information takes place at a lower frequency $f_m$. Thus the principle of the delay circuit of the invention reposes on a change of clock frequency between the acquisition and restoration means on the one hand and the storage means for delaying, on the other.

As litter error as possible should be introduced into the delay applied to the input pulses of the precision code.

For storing the information, with a view to delaying it, the input pulses must be sampled. By sampling the DME input signal at a minimum frequency of 32 MHz, the error due to the lack of synchronization of the pulses of the DME signal with the clock pulses corresponds to a period of this signal, so is less than 31 ns. This corresponds to the resolution necessary for obtaining the required accuracy (±30 ns) with interrogations of the P type. This frequency $f_e$ equal to 32 MHz is a non limiting example of the sampling frequency.

In addition, the considerable delays which the pulses must undergo entails a high capacity with a minimum of components for the means storing the information. For this reason, addressable random access memories (RAM) are used which are memories which may be written into or read out from at any address.

Sampling is carried out so that, at each clock period, a sampled signal is written into the memory. At each clock period, information is also read out which is situated at a preceding address and which has been written previously.

To obtain a 42 μs delay, a RAM having at least 1344 bits is required. Now, such a RAM is not generally commercially available. In addition, the access time to an address of such a RAM memory—between 40 ns and 60 ns—requires a clock frequency $f_m$ applied to the RAM equal at maximum to 8 MHz, a limit value which corresponds to an addressing time of 62.5 ns. This frequency $f_m$ is obtained by simple division of the frequency $f_e$, so the two clocks are synchronized.

So as to keep the initial sampling frequency $f_e$ at 32 MHz, the input DME video signal must be demultiplexed to the four RAM memories having 1024 bits each, connected in parallel and operating at a frequency $f_m$ equal to 8 MHz. The information read simultaneously from these four RAMs will then be multiplexed to the output.

The purpose of the acquisition means 12 shown in FIG. 7 is to sample the information arriving in the form of series pulses and to convert it into four bit binary words, then to store it temporarily. For that, they are formed by a four stage shift register 15, constructed according to the TTL technology, controlled by a first signal of frequency $f_e$ equal to 32 MHz and whose role is to sample the DME signal with a resolution of 31.25 ns then to convert it into a binary word over 4 bits. The parallel outputs of this shift register are connected to the parallel inputs of four storage circuits $B_5$ to $B_8$—flip-flops for example—connected in parallel and serving as a buffer memory, controlled by the same first signal of frequency $f_m$ four times smaller than $f_e$, synchronous with the first signal of frequency $f_e$ and intended for temporarily storing each binary word for 125 ns.

The shift register 15 is formed from four series connected flip-flops $B_1$ to $B_4$, controlled by the same signal of frequency $f_e$. Thus, the DME signal arrives in the form of pulses at input $E_1$ of the first flip flop $B_1$ of the shift register 15. At each step of clock $H_1$, of frequency $f_e$ equals 32 MHz corresponding to a period of 31.25 ns, the pulses progress towards the other flip-flops $B_2$ to $B_4$. At the fourth clock step, the four flip-flops $B_1$ to $B_4$ have stored, at each of their outputs $S_1$ to $S_4$, information in the form of bits which also appears at each of the inputs $E_5$ to $E_8$ of the other four flip-flops $B_5$ to $B_8$ of the buffer memory 16. At the first step of clock $H_2$, of frequency $f_m = 8$ MHz, flip-flops $B_5$ to $B_8$ store these binary words which will remain there until the step of clock $H_2$. Until the following seventh step of clock $H_1$, the following information of the DME signal will be transferred from flip-flop $B_1$ to flip-flop $B_4$ without being stored in the buffer memory 16. On the other hand, at the eighth step of clock $H_1$, this information appearing at the outputs $S_1$ to $S_4$ of the first register 15 in the form of binary words will be stored in its turn in memory 16. The purpose of this storage function is to make the information in the form of four bit binary words stable at the output of the buffer memory 16. At the outputs $S_1$ to $S_4$ of the four flip-flops of the first register 15, they change every 31.25 ns whereas, at the outputs $S_5$ to $S_8$ of the buffer memory 16, they only change every 125 ns, which represents a period of clock $H_2$.

As was seen before, the delay circuit of the invention comprises high capacity storage means 13 i.e., the four RAM memories 17, 18, 19 and 20. In the particular embodiment chosen, they each have 1024 lines which gives a total capacity of 4096 bits. These storage means, shown in FIG. 8, are connected on the one hand to the acquisition means 12 and on the other to the means 14 for restoring the information. The four RAMs are connected in parallel, the inputs of each of them being connected respectively to the four parallel outputs $S_5$ to $S_8$ of the acquisition means. They are each controlled by the same second signal of frequency $f_m$ which is synchronous with the first signal of frequency $f_m$.

The storage means further comprise a circuit 28 for addressing these RAMs, which is controlled by a third signal of frequency $f_m$ synchronous with the preceding $f_m$ signals and presenting to each of them, at each period $T_m$ of said control signal a distinct reading address a and writing address a'. They finally comprise a circuit 24 controlling the read out and writing of the binary words appearing at the output of the acquisition means 12, controlled by a signal of frequency $f_m$ synchronous with the preceding control signal and connected to each of the RAMs.

The addressing circuit 28 is formed by two counters 21 and 22, respectively for reading and writing, each initialized at a value such that the difference between the address for writing in one information and that for reading out the same information may reach 1023 periods $T_m$ of the signal controlling the counters. This allows a maximum possible delay of about 127 $\mu$s. The addressing circuit also comprising a routing circuit 29 for the read out and writing addresses, receiving as input the addresses delivered by the two counters 21 and 22 and outputting one of these two addresses to each of the RAMs. In a particular embodiment, this routing circuit 29 may be formed by 2 AND gates 30 and 31, an inverter 32 and an OR gate 33. A first AND gate 30 receives as input the address from the read-out counter 21 and the control signal of frequency $f_m$; the second AND gate 31 receives the address from the write-in counter 22 and the signal of frequency $f_m$ after passing through the inverter 32 and the OR gate 33 receives as input the output signals from the two respective AND gates for delivering one of these two reading or writing addresses.

The operation of the storage means is as follows: Let us suppose a four bit binary word appearing at the outputs $S_5$ to $S_8$ of the acquisition means, at time t. Since the control signals of frequency $f_e$ for the acquisition and restoration means and a frequency $f_m$ for the storage means are in sync, at time t the control circuit 24 sends a write order to each of the RAMs and the writing counter 22 supplies an address a at which this binary word will be stored in the RAMs. At time $t' = n \cdot T_m$, the reading counter 21 supplies the same address a and the control circuit 24 sends an address for reading the same binary word. There is therefore a delay equal to n times the period $T_m$ of the signal controlling the RAMs between writing in and reading out the same binary word. It is by fixing the value of n that this delay may be adjusted. The resolution obtained is equal to $T_m = 125$ ns. The principle of accessing the RAMs allows any line to be accessed for reading out or writing in a data. In the embodiment chosen, each line of four memories 17 to 20 bears an order number between 0 and 1023 which forms the address of the line. For this reason, the address of each line reaches the memories over a 10 bit bus. In the case of the invention, the addressing circuit 28 is connected to the four memories simultaneously, such that an access to each address gives access to one four bit word.

The diagram showing the operation of these restoration means 14 is given in FIG. 9. It comprises a shift register 34 formed of four flip-flops $B_9$ to $B_{12}$ connected in parallel and controlled by a third signal of frequency $f_m = 8$ MHz. The input $E_9$ to $E_{12}$ of each of the flip-flops $B_9$ to $B_{12}$ is connected to the output $O_1$ to $O_4$ of each of the RAMs of the above described storage means 13 and each of their outputs $S_9$ to $S_{12}$ is connected to a multiplexer circuit 35 operating at the frequency $f_e = 32$ MHz.

During the readout phase, there appears at the output of storage means 13 a binary number which is then stored in the four flip-flops of the shift register 34 playing the role of buffer memory for a period $T_m$ of the control signal namely the next 125 ns, the storage order corresponding to the front which defines the end of the readout phase. The multiplexer 35, operating with a period of 31.25 ns, explores in turn the four outputs of the flip flops, thus multiplexing the delayed output signal.

FIG. 10 shows one example of a timing diagram for the delay circuit of the invention. Signal H represents the signal, of frequency $f_e$ equals to 32 MHz, for sampling the input DME signal in the form of pulse pairs. The next signal H/4 corresponds to one of the control signals of frequency $f_m$ equal to a quarter of $f_e$, namely 8 MHz in the example chosen, these signals being synchronous with the preceding one. It can be seen that its period $T_m$ is four times greater than that $T_e$ of the signal of frequency $f_e$. Below is shown the information to be delayed, that is to say the first pulse of an interrogation pair. It will be noted that, since this latter is not necessarily synchronous with the preceding signals, it may present a shift $\epsilon$ between its arrival time and the beginning of the nearest period $T_e$ of the signal H. Then are shown the four signals appearing at the four parallel outputs $S_1$ to $S_4$ of the shift register 15 and the four signals appearing at a given period i of the signal H/4 at outputs $S_5$ to $S_8$ of the buffer memory 16 forming the acquisition means of the delay circuit. Finally the delayed information is shown after a number of periods appearing at the parallel outputs $O_1$ to $O_4$ of the four RAMs forming the storage means. At the second half period i+n the order is given for reading the four bit binary word stored during the period i and it is at time $t+(n+1)T_m$ that this word is placed in the shift register 34 of the restoration means. It can be seen that the delay introduced by the delay circuit in accordance with the invention is given by the following expression:

$$R=(n+2)T_m-\epsilon$$

with $0 \leq \epsilon < T_e$,
where: n corresponds to the programmed shift of the reading and writing addresses of the memories, $$T_m=(1/f_m)=125 \text{ ns}$$

$$T_e=(1/f_e)=31.25 \text{ ns}$$

The delay is thus obtained with a resolution of 31.25 ns and a maximum delay which may be obtained with storage means of 4096 bits is:

$$R_{max}=(n+2)T_m-\epsilon$$

that is with n=1023

$$R_{max}=128.125 \text{ }\mu s-\epsilon$$

whence 128.093 $\mu s < R_{max} <$ 128.125 $\mu s$.

The delay circuit of the invention is well adapted to the problem to be resolved within the scope of the DME coder and the systematic delay. In fact, long delays may be obtained with good resolution. The values chosen in our application (namely $f_e=32$ MHz, $f_m=8$ MHz, n=4) are not the only possible ones.

This patent application relating to a precision delay circuit provides a DME-P decoder as well as the systematic delay.

Obviously, numerous modifications and variations of the present invention are possible in light of the above teachings. It is therefore to be understood that within the scope of the appended claims, the invention may be practiced otherwise than as specifically described herein.

What is claimed is:
1. A device for delaying an electric signal, comprising:
means for acquiring the electric signal, sampling it at a given frequency $f_e$ and delivering it in parallel in the form of M bit binary words, at a frequency $f_m$ such that:

$$f_m=(f_e/M)$$

means for storing the signal in the form of binary words, operating at the frequency $f_m$ and storing each M bit binary word for a given period of time, means for restoring at the frequency $f_e$ the electric signal from M bit binary words delivered in parallel by the storage means.

2. A delay device as claimed in claim 1, wherein said means for acquiring the signal comprise:
an M stage shift register, comprising M series connected storage circuits controlled by the same signal of given frequency $f_e$, whose role is to sample the electric signal and to convert it into binary words each comprising M bits;
a buffer memory with M stages comprising M parallel connected storage circuits, controlled by the same signal of frequency $f_m$, such that:

$$f_m=(f_e/M)$$

this signal of frequency $f_m$ being moreover synchronous with the signal of frequency $f_e$ and the parallel inputs of the M storage circuits of the buffer memory being connected respectively to the M outputs of the storage circuits of the shift register, this buffer memory storing temporarily each binary word of M bits transiting between the shift register and the storage means of the delay device.

3. A delay device as claimed in claim 1 or 2, characterized in that the means for storing the signal in the form of M bit binary words comprise:
M addressable random access memories, connected in parallel, controlled by the same signal of frequency $f_m$, synchronous with the signals for controlling the acquisition means, the inputs of each of the memories being connected respectively to the M parallel outputs of the acquisition means;
a circuit for addressing said random access memories, controlled by a signal of frequency $f_m$ synchronous with the preceding control signal and presenting to each, at each period of said control signal, a distinct reading address a and writing address a';
a control circuit for reading and writing the binary words appearing at the output of the acquisition means, controlled by a signal of frequency $f_m$, synchronous with the preceding control signal, and connected to each of the memories.

4. A delay device according to claim 1 wherein said addressing circuit comprises:
a reading counter,
a writing counter,
each initialized at a value such that the difference between the writing address for one binary word and that for reading same is equal to a given number of periods of the control signal,
a routing circuit for the reading and writing addresses, receiving as input the addresses from the two counters and delivering at the output a single one of these two addresses to each of the memories.

5. A delay device as in claim 1 wherein said routing circuit comprises
a first AND gate receiving as input the address of the reading counter and the control signal of frequency $f_m$;
a second AND gate receiving as input the address from the writing counter and the signal of frequency $f_m$ after it has passed through an inverter circuit;
an OR gate receiving as input the output signals from the two AND gates and outputting one of the reading or writing addresses.

6. A delay device as in claim 1 wherein the means for restoring the signal comprise
a shift register with M stages, comprising M parallel connected storage circuits, controlled by the same signal of frequency $f_m$ synchronous with the preceding control signals the inputs of the M storage circuits being connected respectively to the M parallel outputs of the storage means, whose role is that of a buffer memory;
a multiplexer controlled by a delivered signal of frequency $f_e$ synchronous with the preceding control signal, whose n inputs are connected respectively to the outputs of the M storage circuits of said shift register and whose output delivers the electric signal.

7. Application of the delay device as in claim 1 to a decoding device for a transponder forming part of distance measuring equipment, wherein:
the frequency $f_e$ is equal to 32 MHz,
frequency $f_m$ is equal to 8 MHz,
the number n is equal to 4.

* * * * *